United States Patent
Yamaguchi

(10) Patent No.: US 9,755,584 B2
(45) Date of Patent: Sep. 5, 2017

(54) AMPLIFIER

(71) Applicant: KABUSHIKI KAISHA TOSHIBA, Tokyo (JP)

(72) Inventor: Keiichi Yamaguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/267,325

(22) Filed: Sep. 16, 2016

(65) Prior Publication Data

US 2017/0141740 A1  May 18, 2017

(30) Foreign Application Priority Data

Nov. 17, 2015 (JP) .................. 2015-225162

(51) Int. Cl.
| | |
|---|---|
| H03F 3/191 | (2006.01) |
| H03F 1/32 | (2006.01) |
| H03F 3/193 | (2006.01) |
| H03F 3/21 | (2006.01) |
| H03F 1/56 | (2006.01) |

(52) U.S. Cl.
CPC ............. *H03F 1/3247* (2013.01); *H03F 1/56* (2013.01); *H03F 3/193* (2013.01); *H03F 3/21* (2013.01); *H03F 2200/222* (2013.01); *H03F 2200/451* (2013.01)

(58) Field of Classification Search
CPC ...................................... H03F 3/191
USPC ................................. 330/302, 290
See application file for complete search history.

(56) References Cited

U.S. PATENT DOCUMENTS

| | | | | | |
|---|---|---|---|---|---|
| 4,835,485 | A | * | 5/1989 | Mueller | H03F 3/193 330/277 |
| 4,875,019 | A | * | 10/1989 | Monson | H03F 1/565 330/300 |
| 5,051,706 | A | * | 9/1991 | Zushi | H03F 3/1935 330/277 |

(Continued)

OTHER PUBLICATIONS

Sokal et.al., "Class E—A New Class of High Efficiency Tuned Single-Ended Switching Power Amplifiers", IEEE Journal of Solid-State Circuits, vol. SC-10, No. 3, pp. 168-176, (1975).

(Continued)

*Primary Examiner* — Henry Choe
(74) *Attorney, Agent, or Firm* — Finnegan, Henderson, Farabow, Garrett & Dunner, L.L.P.

(57) ABSTRACT

According to one embodiment, an amplifier includes: a transistor; a ground circuit connected to a ground terminal of the transistor; a first capacitor connected between an output terminal of the transistor and the ground circuit; a first inductor connected to the output terminal of the transistor; a second capacitor connected between the first inductor and the ground circuit; a bias circuit connected between the first inductor and the ground circuit; a first circuit connected to the output terminal of the transistor, the first circuit including a second inductor and a third capacitor connected in series to the second inductor; a fourth capacitor connected between the first circuit and a load circuit; a fifth capacitor connected between an output terminal of the first circuit and the ground circuit; and a third inductor connected between a terminal on a load circuit side of the fourth capacitor and the ground circuit.

16 Claims, 14 Drawing Sheets

(56) References Cited

U.S. PATENT DOCUMENTS 8,350,627 B2* 1/2013 Hellberg ............... H03F 1/0205
  330/302
8,717,102 B2* 5/2014 Wilson ................... H03F 3/193
  330/124 R

OTHER PUBLICATIONS

Kazimierczuk, "Class E Tuned Power Amplifier with Shunt Inductor", IEEE Journal of Solid-State Circuits, vol. SC-16, No. 1, pp. 2-7, (1981).
Everard et.al., "Broadband Power Efficient Class E Amplifiers with a non-linear CAD Model of the Active MOS Device", Journal of the Institution of Electronic and Radio Engineers, vol. 57, No. 2, pp. 52-58, (1987).
Zulinski et. al., "Class E Power Amplifiers and Frequency multipliers with Finite DC-Feed Inductance", IEEE Transactions on Circuits and Systems, vol. CAS-34, No. 9, pp. 1074-1087, (1987).
Aitchison et. al., "A Circuit Technique for Broadbanding the Electronic Tuning Range of Gunn Oscillators", IEEE Journal of Solid-State Circuits, vol. SC-12, No. 1, pp. 21-28, (1977).
Grebennikov, "Simple Design Equations for Broadband Class E Power Amplifiers with Reactance Compensation", IEEE MTT-S Digest, THIF-38, pp. 2143-2146, (2001).

* cited by examiner

AMPLIFIER

CROSS-REFERENCE TO RELATED APPLICATIONS

This application is based upon and claims the benefit of priority from Japanese Patent Application No. 2015-225162, filed on Nov. 17, 2015; the entire contents of which are incorporated herein by reference.

FIELD

Embodiments described herein relate to an amplifier.

BACKGROUND

In order to realize a highly efficient operation in an amplifier, it is ideal to use the amplifier near saturated electric power and optimize load impedance taking into account even harmonics such as a second harmonics and a third harmonics. Amplifiers are called class-A, class-B, class-C, class-J, class-D, class-E, and class-F according to the load impedance and overdrive and depths of bias. However, these are classifications for convenience. Essential operations are similar. In particular, the amplifiers have similar dynamic load lines under a condition in which maximum efficiency is obtained. That is, in the case of a common source, an operation condition is set to minimize power consumption inside a device such that time waveforms of a drain current and a drain voltage (in the case of bipolar, a collector current and a collector voltage when a common emitter) do not overlap at the same time, that is, an Instantaneous product of an electric current and a voltage does not increase.

In general, as means for realizing any load impedance, a resonant no loss matching (tuned) circuit is adopted. Therefore, a range of frequencies in which target impedance is obtained is limited to a tuning frequency range. It is difficult to independently control impedance between adjacent harmonics such as between a DC and a fundamental frequency, between the fundamental frequency and a second harmonics, and between the second harmonics and third harmonics. It is necessary to improve frequency separation using a circuit having high Q to show ideal impedances at respective frequencies. As a result, a band is narrowed. In this way, high efficiency and a wide band is in a contradictory relation. Therefore, conventionally, in general, a high-efficiency circuit has a narrow band.

As an amplifier according to a first related technique, there is known an amplifier that, making use of a fact that the Impedance of a series resonator composed of a capacitor (a capacitor X1) and a coil (an inductor) (an Inductor Y1) is zero at fundamental frequency, gives load impedance at the fundamental frequency using a series circuit of an inductor Y1' connected in series to the series resonator and a load resistor and parallel connection of the series circuit and a capacitor (a capacitor X2). In the amplifier, only the capacitor X2 is shown making use of the fact that series impedance of the capacitor X1 and the Inductor Y1 is high with respect to harmonics. An inductor (an inductor Y2) parallel to the capacitor X2 is selected to allow only a direct current (DC) to pass and have high impedance at a radio frequency (RF). A resonant frequency of a series resonator composed of Y1-Y1'-X1 is lower than the fundamental frequency. If a Q value of a series resonator composed of the capacitor X1 and the inductor Y1 is set to be low, even if the resonant frequency is detuned from the fundamental frequency, a value close to satisfactory load impedance (or load admittance) can be maintained. However, an ideal operation cannot be obtained because harmonic impedance decreases.

As another form of the amplifier, a switching operation performed by interchanging a relation between the capacitor X2 and the inductor (the coil) Y1' has been examined (a second related technique). It has been demonstrated that equivalent characteristics can be obtained by appropriately selecting load impedance.

In the first related technique, it is known that an angle of load impedance in the fundamental frequency is approximately 33 degrees and an angle given by the inductor Y1' is approximately 49 degrees. There is known a method of giving, with another means, the angle given by the inductor Y1' and further connecting the capacitor X2 to optimize a circuit such that the angle is fixed at approximately 33 degrees within a desired band (a third related technique). In the third related technique, it has been demonstrated that the angle of the load impedance can be kept fixed in a band by connecting an inductor Y" In parallel to the parallel capacitor X2 instead of the inductor Y1' connected in series to the series resonator. In the inductor Y", the Inductor Y2 in the first related technique is set to a finite value. However, the third related technique demonstrates that susceptance of the inductor Y" is cancelled by susceptance of the series resonant circuit of X1-Y1 to obtain a fixed angle of 49 degree in a band. If the parallel capacitor X2 is connected to the inductor Y", an angle in the band inclines. A method for circuit optimization by a circuit analysis CAD is used in order to fix the load impedance at 33 degrees. Eventually, it has not been clarified by what kind of mechanism the load impedance with the fixed angle is realized. Therefore, theory has not reached calculation of Y" by algebraic calculation. A load circuit equivalent to X1-Y1 is replaced with a n impedance converter and a T Chebyshev band-pass filter. However, since a Q value of the entire circuit is low, harmonic impedance greatly deviates from an ideal value, power efficiency and frequency characteristics of output power are poor, and the number of elements of the circuit is large.

As another form of the amplifier of the first related technique, there is an attempt to reduce the inductance of the inductor Y2 and use, as a parallel resonator, a circuit composed of the inductor Y2 and the inductor X2 (a fourth related technique). Unlike the third related technique, Y2 (equivalent to Y" of the third related technique) is algebraically calculated. As a result, it has been demonstrated that there is possibility of presence of a design condition in which an angle that should be shown at an operation frequency of the series resonator composed of Y1-Y1'-X1 can be reduced to zero (that is, Y' can be deleted) by setting Y2 to a finite value. When Y2 is set to the finite value and Y' is deleted, a change to a circuit topology different from a circuit topology in the first related technique is enabled. That is, it is possible to configure a highly efficient amplifier with the parallel resonator by X2-Y2 (or X2-Y") and the series resonator by X1-Y1.

On the other hand, a method of compensating for reactance (equivalent to the angle mentioned above) of the parallel resonator has been known since long time ago. For example, there is known a method of connecting the series resonator to the parallel resonator or connecting the series resonator to the parallel resonator and further connecting the parallel resonator to compensate for a reactance component (an imaginary part of impedance; equivalent to the angle mentioned above) (a fifth related technique). A principle of this method is simple. This makes use of the fact that, in the principle of an electric circuit, whereas the reactance component of the parallel resonator decreases near a resonant point, the reactance of the series resonator increases near the resonant point. The increase and the decrease in the reactances are offset and values of the reactances generally coincide. Inclinations of the reactances are adjusted by Q values of the respective resonators. The fifth related technique is a trial itself in the third related technique.

There is known a sixth related technique in which the fifth related technique is applied to the amplifier of the fourth related technique and a design condition unclear in the third related technique is clarified. However, in the derived design condition, it is necessary to use a value around 1 as the Q value of the resonator. Therefore, even if the reactance component of the fundamental frequency can be compensated, a real part of admittance or impedance fluctuates in the fundamental frequency band. In addition, a real part of admittance does not sufficiently decrease in a frequency band of a second harmonics. As a result, satisfactory characteristics cannot be obtained in a wide band. In this regard, a technical progress from the third related technique can be considered to be absent.

There has been a problem in that compensation of the imaginary part (the reactance component) of the impedance and the imaginary part (the susceptance component) of the admittance is focused and it is not taken into account at all that flatness of the real part necessary for fixing output power in the fundamental frequency band and a sufficiently low real part in a harmonic band necessary for efficiency improvement, voltage amplitude suppression, and harmonic leak prevention are realized. As it is seen in, for example, the third related technique, it has been necessary to connect, to a post stage, in addition to a reactance compensation circuit, a post-stage circuit for converting optimum impedance of the fundamental frequency to 50Ω in order to connect the optimum impedance to an external circuit and it has been necessary to connect, to the post stage, a wideband cutoff filter for cutting off a leak of harmonics. Therefore, a circuit size is considerably large.

DETAILED DESCRIPTION

According to one embodiment, an amplifier includes: a transistor; a ground circuit electrically connected to a ground terminal of the transistor; a first capacitor electrically connected between an output terminal of the transistor and the ground circuit; a first inductor electrically connected to the output terminal of the transistor; a second capacitor electrically connected between the first inductor and the ground circuit; a bias circuit connected between the first inductor and the ground circuit; a first circuit electrically connected to the output terminal of the transistor, the first circuit including a second inductor and a third capacitor connected in series to the second inductor; a fourth capacitor connected between the first circuit and a load circuit; a fifth capacitor connected between an output terminal of the first circuit, which is a terminal on a the load circuit side of the first circuit, and the ground circuit; and a third inductor connected between a terminal on a load circuit side of the fourth capacitor and the ground circuit.

Embodiments of the present invention relate to a power amplifying technique and, more particularly, relate to a power control circuit, a power transmission circuit, or a high-frequency power amplifier circuit. An amplifier (or an amplifier circuit) in the embodiments is used in, for example, a power-supply control circuit or a power transmission circuit such as a DC-DC converter or a high-frequency amplifier circuit for wireless. The amplifier belongs to a classification generally called switching amplifier. The amplifier has a characteristic that, when the amplifier is used in being saturated, high power efficiency is obtained compared with other amplification schemes. Note that the amplifier has an operation close to an operation called class-E among switching amplifiers. Embodiments of the present invention are explained below with reference to the drawings.

Figure 1:
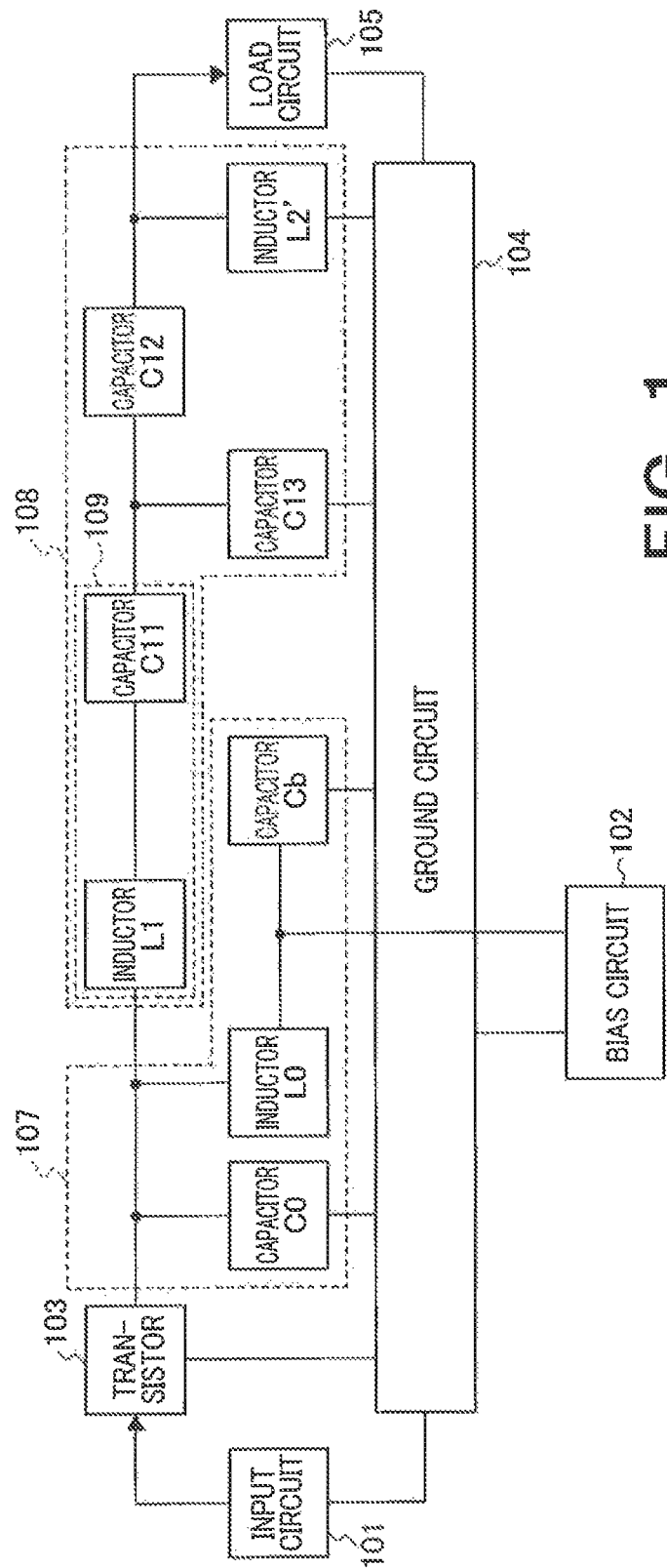
FIG. 1 is a circuit block diagram of an amplifier according to a first embodiment.
Figure 2:
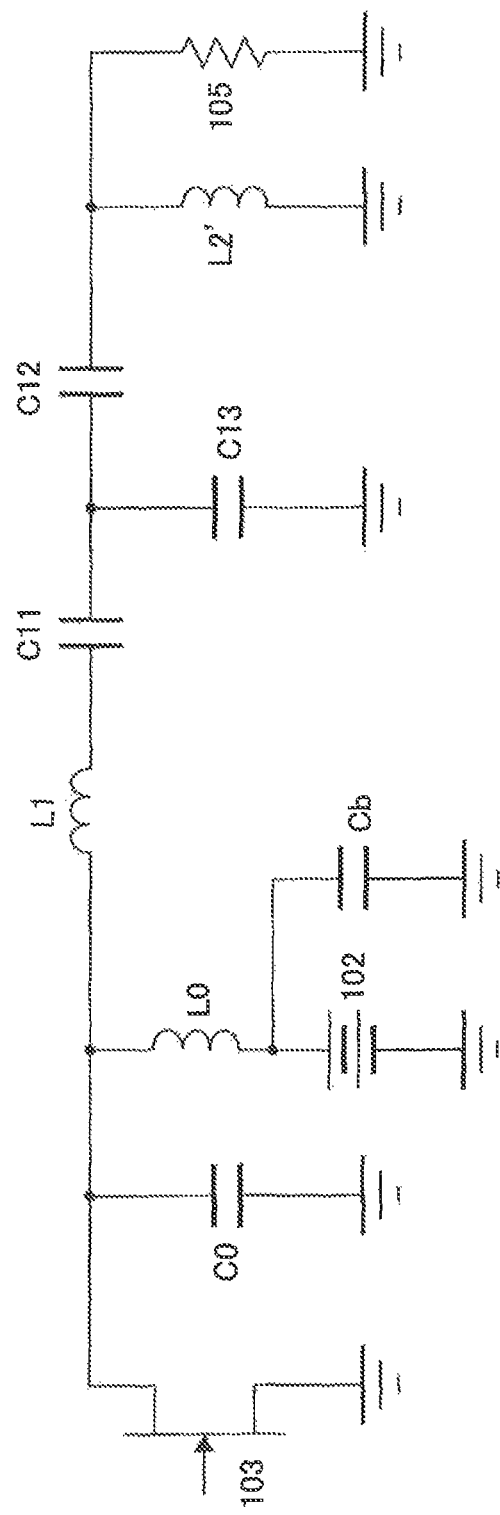
FIG. 2 is a diagram showing a specific configuration example of the amplifier shown in FIG. 1 using circuit symbol.

FIG. 1 is a circuit block diagram of an amplifier according to a first embodiment. FIG. 2 is a diagram showing a specific configuration example of the amplifier shown in FIG. 1 using circuit symbol. Corresponding elements in the figures are denoted by the same reference numerals and symbol. The configuration shown in FIG. 2 is an example. The amplifier is not limited to this circuit configuration.

The amplifier shown in FIG. 1 includes a transistor 103, a ground circuit 104, a bias circuit 102, an input circuit 101 including a signal source, a pre-stage circuit 107, which is a parallel resonant circuit, and a post-stage circuit 108 that performs phase compensation, impedance conversion, and harmonic suppression. The Input circuit 101 includes a bias circuit, a stabilization circuit, and a matching circuit according to necessity. The amplifier is electrically connected to the input circuit 101 and receives an input signal to be amplified. The amplifier is electrically connected to a load circuit 105. Output power amplified by the amplifier is supplied to the load circuit 105. The input circuit 101 may be a part of the amplifier.

The input circuit 101 is electrically connected between a control terminal (an input terminal) of the transistor 103 and the ground circuit 104. The input circuit 101 includes the signal source that generates a signal to be amplified. The signal generated by the signal source may be a sine wave or may be a square wave or a waveform equivalent to the square wave to make it easily to perform a switching operation. A duty ratio of the transistor 103 driven by the input circuit 101 is, for example, 50%. The duty ratio can be freely set by appropriately designing load impedances of the pre-stage circuit 107 and the post-stage circuit 108, which are equivalent to a load circuit, and the load circuit 105. The input circuit 101 outputs the signal generated by the signal source to the control terminal of the transistor 103.

The transistor 103 may be any amplification element such as a bipolar transistor or a field effect transistor (FET). In the example shown in FIG. 2, the transistor 103 is the field effect transistor. A type of the transistor 103 is not particularly limited. Device structures such as a BJT, an HBT, a MOSFET, an LDMOS, a JFET, and a HEMT are not particularly limited. Materials such as silicon and a compound semiconductor are not particularly limited. A common terminal is not particularly limited. In most cases, a common emitter is used in the bipolar transistor. A common source is used in the field effect transistor. In the case of the common source, an input terminal (a control terminal) is equivalent to a gate, an output terminal is equivalent to a drain, and a ground terminal is equivalent to a source. The transistor 103 may be configured from a plurality of transistor elements. In this case, a connection structure of the transistor elements such as cascode, Darlington, and parallel connection are not particularly limited.

The bias circuit included in the Input circuit 101 is a circuit for determining an operating bias point of the transistor 103. A bias point of the amplifier is set near a threshold voltage of the transistor 103. It is possible to adjust a gain, output power, efficiency, and harmonics by making the bias point deep and shallow as appropriate. The bias point is not particularly limited. It is possible to adjust mainly output power and efficiency by controlling a voltage supplied from the bias circuit 102. The voltage supplied from the bias circuit 102 should be adjusted not to exceed breakdown voltages of the devices. However, the supplied voltage is not particularly limited.

The pre-stage circuit 107 is a circuit for showing the load impedance of the transistor 103 inductive. The pre-stage circuit 107 includes a capacitor C0, an inductor L0, and a capacitor Cb.

The post-stage circuit 108 is a circuit including a function of converting the impedance of the load circuit 105 to optimum load impedance of the transistor 103 and performing the phase compensation and the harmonic suppression. The post-stage circuit 108 includes an inductor L1, a capacitor C11, a capacitor C13, a capacitor C12, and an inductor L2'.

The input terminal (the control terminal) of the transistor 103 is electrically connected to an output terminal of the input circuit 101 and receives a signal output from the signal source. One end (an output terminal) of the transistor 103 is electrically connected to the pre-stage circuit 107. The other end (a ground terminal) of the transistor 103 is electrically connected to the ground circuit 104.

One end of the bias circuit 102 is electrically connected between the inductor L0 and the capacitor Cb in the pre-stage circuit 107. The other end of the bias circuit 102 is electrically connected to the ground circuit 104. The bias circuit 102 applies a DC (direct current) bias serving as a power supply of the amplifier. The bias circuit 102 includes a direct-current power supply (DC power supply) (see reference numeral 102 in FIG. 2 referred to below). The bias circuit 102 includes, according to necessity, a decoupling circuit for reducing power supply impedance, a choke for increasing harmonic impedance, a functional component that simultaneously gives functions of both of the decoupling circuit and the choke or equivalent to the decoupling circuit and the choke, or the like.

The bias circuit 102 does not always need to be connected via the inductor L0. As it is well known, it is possible to feed electric power from any place using a bias tee. For example, it is also possible to directly supply a bias to the output terminal of the transistor 103 using a bias tee having high impedance at a relevant frequency. Note that the bias circuit 102 can include, on the inside, a circuit equivalent to the bias tee according to necessity as explained above.

The ground circuit 104 functions as a return path of the direct-current power supply and applies reference potential. In FIG. 2, the ground circuit 104 is represented by a symbol indicating the ground or the earth. Parasitic inductances are present among terminals (terminals connected to the input circuit, the capacitor, the inductor, and the load circuit) of the ground circuit 104.

The position of the capacitor C0 does not have to be the position shown in FIG. 1 or FIG. 2 and may be a position between the inductor L0 and the inductor L1 (right side of L0).

One end of the Inductor L1 in the post-stage circuit 108 is electrically connected to an output of the pre-stage circuit 107, more specifically, an output terminal of the transistor. The other end of the Inductor L1 is electrically connected to one end of the capacitor C11. The inductor L1 and the capacitor C11 configure a series resonator. The connection order of the inductor L1 and the capacitor C11 may be reversed. That is, in a circuit 109 including the inductor L1 and the capacitor C11, the connection order of the inductor L1 and the capacitor C11 may be any order.

The other end of the capacitor C11 is electrically connected to the ground circuit 104 via the capacitor C13. One end of the capacitor C12 is electrically connected to the ground circuit 104 via the capacitor C13. The capacitor C12 is disposed between the capacitor C11 and the load circuit 105. The capacitors C11, C12, and C13 configure a so-called T circuit. The other end of the capacitor C12 is electrically connected to the ground circuit 104 via the inductor L2'.

An output terminal of the post-stage circuit 108, that is, an output terminal of the amplifier is electrically connected to the load circuit 105. One end of the load circuit 105 is electrically connected to the output terminal of the post-stage circuit 108. The other end of the load circuit 105 is electrically connected to the ground circuit 104. The Input impedance of the load circuit 105 is often selected to be 50Ω. However, the harmonic impedance of the load circuit 105 often deviates from 50Ω. As explained below, the amplifier in this embodiment has a configuration not easily affected by the harmonic impedance of the load circuit 105. A harmonic trap (a circuit for preventing a leak or an output of harmonics) may be separately provided in the load circuit 105.

Figure 3:
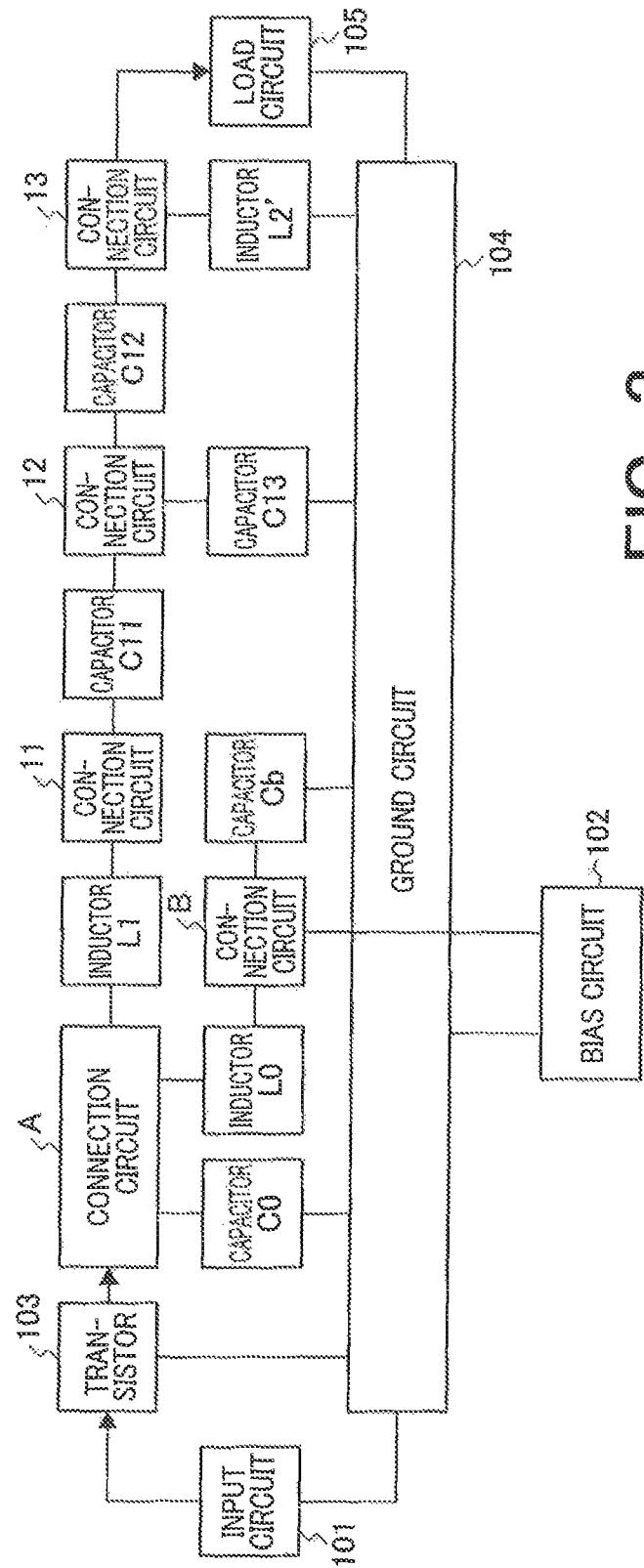
FIG. 3 is a diagram which uses connection circuits for connecting each element in the amplifier shown in FIG. 1.

Connection circuits for connecting the plurality of elements in the amplifier to one another may be disposed among the elements. An example of a circuit block diagram in this case is shown in FIG. 3. A connection circuit A, a connection circuit B, a connection circuit 11, a connection circuit 12, and a connection circuit 13 are disposed.

The connection circuit A includes terminals connected to the transistor 103, the capacitor C0, the inductor L0, and the inductor L1. These elements are electrically connected by the terminals. The connection circuit A is equivalent to a connection structure for physically connecting an intrinsic region portion of the transistor 103 to the inductor L0 or, according to necessity, to the capacitor C0.

In the case of a monolithic IC (Integrated Circuit), the connection circuit A is equivalent to leading-out and routing portion in a pattern. When a package device is mounted on a PCB (Printed Circuit Board), the connection circuit A is equivalent to a portion including a structure inside a package, in which on-chip and feed-through are included, and a pattern on the PCB. Usually, since the connection circuit A has a finite dimension, the connection circuit A has capacitance (parasitic capacitance) between the connection circuit A and the ground circuit 104. Inductances are present among each of terminals (terminals connected to the transistor, the capacitor, and the inductor) of the connection circuit A. It is possible to bring impedance close to ideal impedance by actively using the capacitance and the inductances. For example, the capacitance of the capacitor C0 can be substituted by the parasitic capacitance of the connection circuit A. In this case, a configuration in which the capacitor C0 is omitted is also conceivable. The connection circuit A can bear a part or the entire inductance L0 or a part or the entire inductance L1.

The connection circuit B is equivalent to a connection structure disposed between the inductor L0 and the capacitor Cb to physically connect the Inductor L0 and the capacitor Cb. The bias circuit 102 functioning as the power supply of the amplifier is connected to the connection circuit B. The connection circuit B is connected to the ground circuit 104 via the bias circuit 102. The connection circuit B includes a plurality of terminals connected to the inductor L0, the capacitor Cb, and the bias circuit 102.

The connection circuit 11 connects the inductor L1 and the capacitor C11. The connection circuit 11 includes a plurality of terminals connected to the inductor L1 and the capacitor C11. The connection circuit 11 includes parasitic inductances among the connection terminals. Therefore, a value of the inductance of the inductor L1 may be determined taking into account the parasitic inductances.

The connection circuit 12 connects the capacitor C11, the capacitor C12, and the capacitor C13. The capacitor C13 is connected between the connection circuit 12 and the ground circuit 104. The connection circuit 12 includes a plurality of terminals connected to the capacitor C11, the capacitor C12, and the capacitor C13. A value of the capacitance of the capacitor C13 may be determined taking into account parasitic capacitance formed between the connection circuit 12 and the ground circuit 104.

The connection circuit 13 connects the capacitor C12, the Inductor L2', and the load circuit 105. The connection circuit 13 has a role of the output terminal of the amplifier. The load circuit 105 is connected between the connection circuit 13 and the ground circuit 104. The Inductor L2' is connected between the connection circuit 13 and the ground circuit 104. The capacitor C12 is connected between the connection circuit 13 and the connection circuit 12. Values of the capacitor C12 and the inductance L2' may be determined taking into account a parasitic component of the connection circuit 13.

For example, circuit element values (hereinafter, element values) in the amplifier are set to reduce a deviation between a real part and an imaginary part in a fundamental frequency band and reduce a maximum of a real part of harmonics of second harmonics frequency or the like concerning admittance on the load circuit side viewed from a node in which the transistor 103 is seen as a switching element (that is, the intrinsic region of the transistor 103; in a frequency band in which a parasitic component can be neglected, an output terminal of a package or a chip or a terminal on the transistor 103 side of the connection point A). For example, the element values are adjusted such that the deviation of the real part in the fundamental frequency band is within 10%, the deviation of the imaginary part is within 10%, and the maximum of the real part of the second harmonics frequency is equal to or smaller than a quarter of a fundamental frequency.

In determining the circuit element values in the amplifier, various approaches are conceivable. After an Initial value is determined using a logical formula, the adjustment of the element values may be performed in the actual amplifier. Alternatively, it is also possible to perform optimization of the element values using a simulator and finally perform the adjustment in the actual amplifier.

Figure 13:
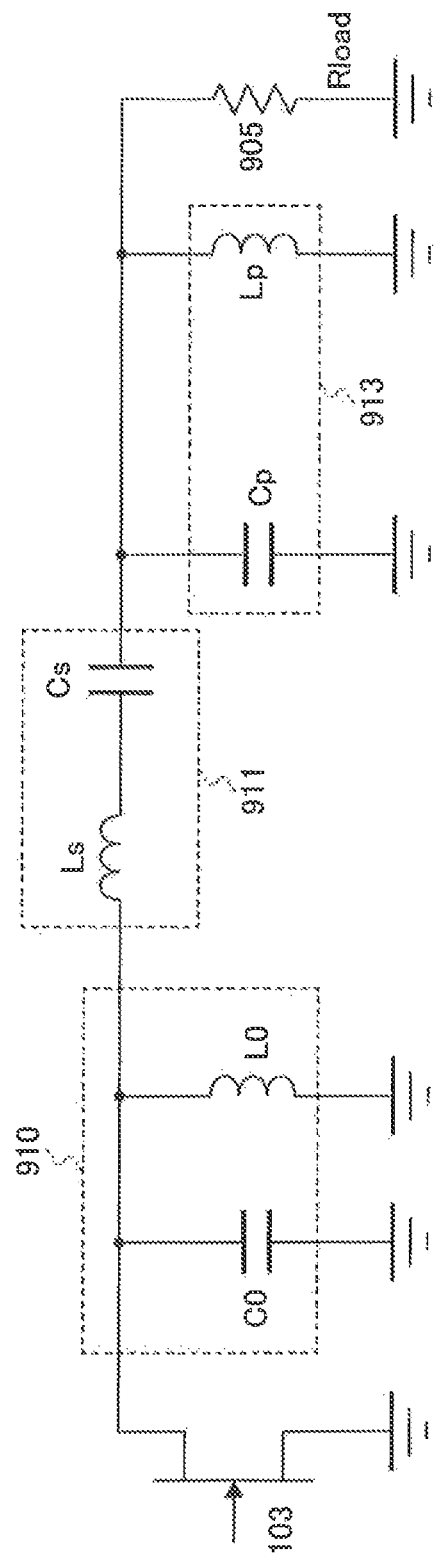
FIG. 13 is a configuration diagram of an amplifier according to a related technique.

In FIG. 13, a circuit block diagram of an amplifier according to a related technique is shown. A circuit diagram in which circuit symbol are used is shown as in FIG. 2. The amplifier includes the transistor 103, the capacitor C0 and the inductor L0 connected in parallel, an inductor Ls and a capacitor Cs connected in series, a capacitor Cp and an Inductor Lp connected in parallel, and a load circuit 905. The capacitor C0 and the inductor L0 connected in parallel form a parallel resonant circuit 910. The inductor Ls and the capacitor Cs connected in series form a series resonant circuit 911. The capacitor Cp and the inductor Lp connected in parallel form a parallel resonant circuit 913. Note that, as in FIGS. 1 to 3, the capacitor Cb may be disposed and a bias circuit may be connected between the Inductor L0 and a ground circuit to feed electric power.

Figure 14:
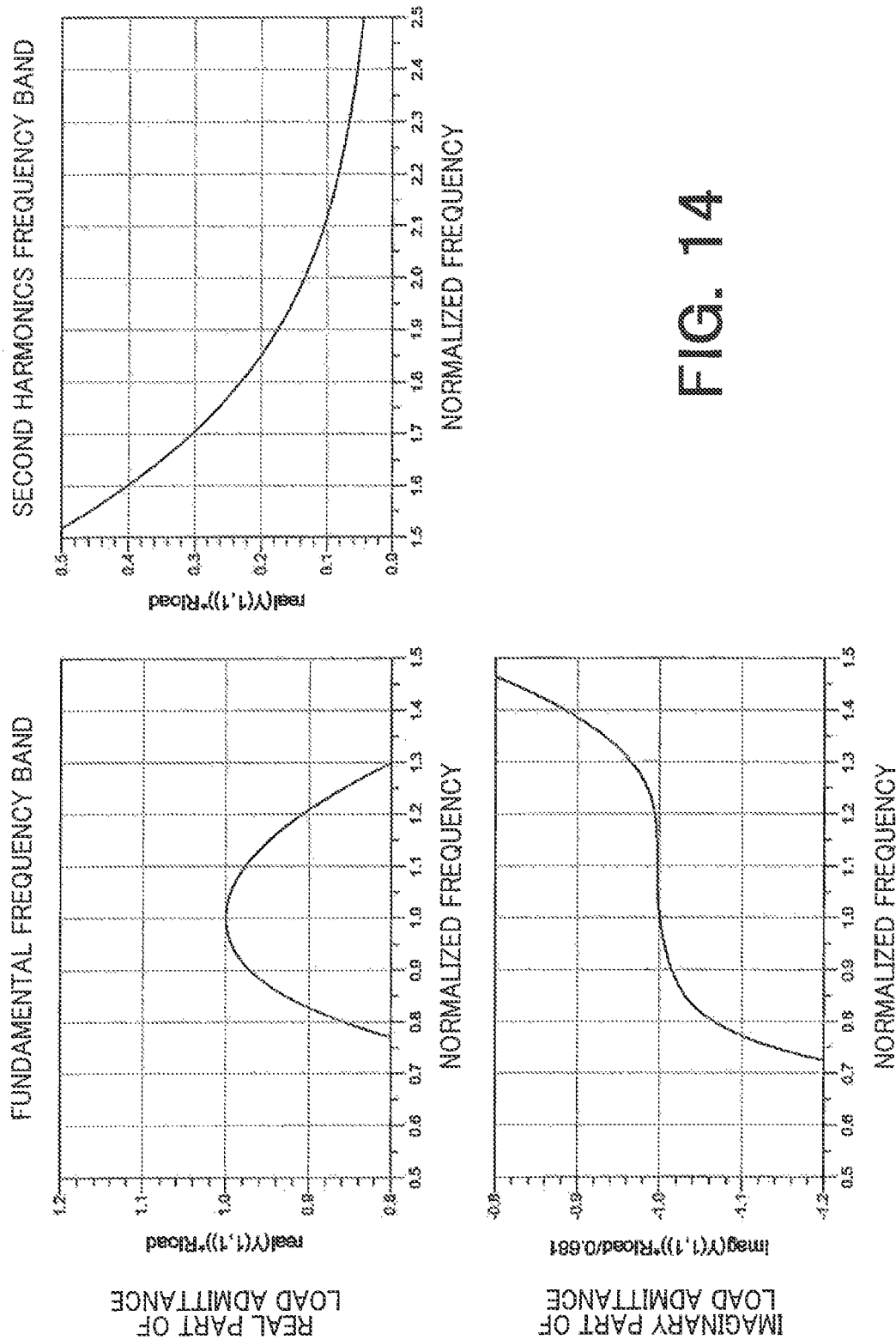
FIG. 14 is a diagram showing an example of frequency characteristics of the amplifier according to the related technique.

Frequency characteristics of the amplifier shown in FIG. 13 are shown in FIG. 14. An upper part of the figure shows a relation between a real part (in the figure, real(Y(1, 1))*Rload) of normalized load admittance viewed from an output end (of an intrinsic part) of the transistor and a normalized frequency. The normalized frequency is normalized in a design center. The normalized admittance is normalized by a resistance value of the load circuit 905. The left side shows a fundamental frequency band and the right side shows second harmonics frequency band. A lower part of the figure shows normalized susceptance (in the figure, imag(Y(1, 1))*Rload/0.681) in an imaginary part of the load admittance in the fundamental frequency band. The imaginary part is equivalent to susceptance and the real part is equivalent to conductance. In the related technique, it is attempted to obtain characteristics such as efficiency and output power equivalent to a center frequency in a detuned frequency by setting the susceptance flat (to a value with a small deviation) in the fundamental frequency band. As shown in the lower part, the susceptance is flat in the fundamental frequency band (e.g., a fixed frequency range centering on 1.0). However, as it is seen from the right figure of FIG. 14, the load conductance is high as a whole in the second harmonics frequency band (e.g., a fixed frequency range centering on 2.0 GHz). This causes deterioration in power efficiency, a decrease in output power, and an increase in a voltage amplitude.

Figure 10:
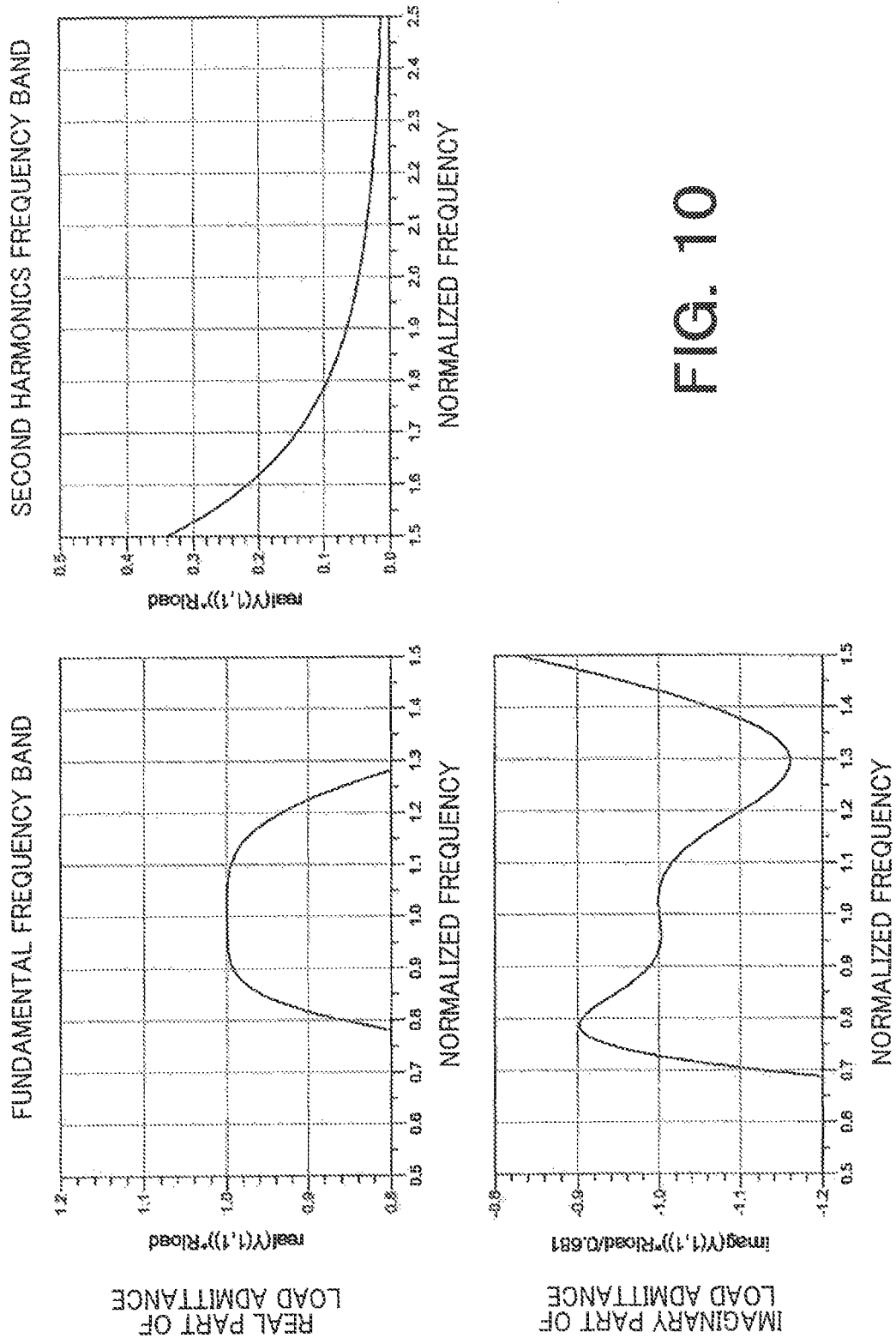
FIG. 10 is a diagram showing an example of frequency characteristics of an amplifier according to an embodiment of the present invention.

In FIG. 10, frequency characteristics of the amplifier according to this embodiment are shown. As in FIG. 14, an upper part of the figure shows a relation between a real part (in the figure, real(Y(1, 1))*Rload) of normalized load admittance viewed from an output (of an intrinsic part) of the transistor (or a terminal on a transistor side of the connection circuit A) and a normalized frequency. The left side shows characteristics in a fundamental frequency band and the right side shows characteristics in a second harmonics frequency band. A lower part of the figure shows frequency characteristics of an Imaginary part (in the figure, imag(Y(1, 1))*Rload/0.681) of the normalized load admittance in the fundamental frequency band. The imaginary part is equivalent to susceptance.

The amplifier in this embodiment is characterized by securing flatness of the real part and keeping the real part low in the second harmonics frequency band while allowing the flatness of the imaginary part in the fundamental frequency band to be slightly deteriorated. For example, the element values are set (adjusted) to keep the maximum of the real part of the second harmonics frequency band to be a quarter or less of the maximum in the fundamental frequency band while keeping the deviation of the real part in the fundamental frequency band within 10% and keeping the deviation of the Imaginary part within 10%.

Keeping the deviation of the real part within 10% means that, for example, the deviation is between a maximum of a range of fluctuation in the fundamental frequency band and a value 10% lower than the maximum. Alternatively, the deviation may be defined as upper and lower ranges respectively within 10% centering on a value of a center frequency of the fundamental frequency band. A method of the definition may be optional. An allowable fluctuation range only has to be defined. 10% is also an example. In general, the deviation only has to be $\alpha$%. The same applies to the imaginary part. In general, the deviation only has to be kept within $\beta$%.

In FIG. 10, the maximum of the real part of the fundamental frequency band (e.g., the center frequency is 1.0) is, for example, 1.0. The value of the real part is reduced to 0.25 (=1.0/4) or less in the second harmonics frequency band (e.g., a fixed frequency range centering on 2.0 GHz). That is, the maximum of the real part of the second harmonics frequency band is a quarter or less of the maximum of the fundamental frequency band.

In this way, high power efficiency is obtained by prioritizing the flatness of the real part and keeping the real part in the second harmonics frequency band low while allowing a decrease (allowing slight fluctuation) in the flatness of the imaginary part in the fundamental frequency band. That is, it is important to obtain not only phase compensation (securing of the flatness of the imaginary part) of the fundamental frequency band but also securing of the flatness of the real part and high reflectivity of the second harmonics frequency band (not to output the second harmonics frequency). In the configuration of the amplifier in this embodiment, it is possible to obtain such characteristics by appropriately selecting the element values of the amplifier.

Further, as a condition of the element value selection, for example, a condition that the load impedance is twice or more as large as the value of the real part of the fundamental frequency band may be added.

In this way, it is possible to maintain the values of the real part and the imaginary part of the fundamental frequency band at a value of the center frequency in the band or in a range close to the value and realize, with a small number of elements, a circuit in which the value of the real part in the harmonic band is sufficiently reduced. It is possible to set output power and power efficiency to satisfactory values and suitably suppress a harmonic leak. Further, it is possible to keep voltage amplitude lower than break down voltage.

Figure 11:
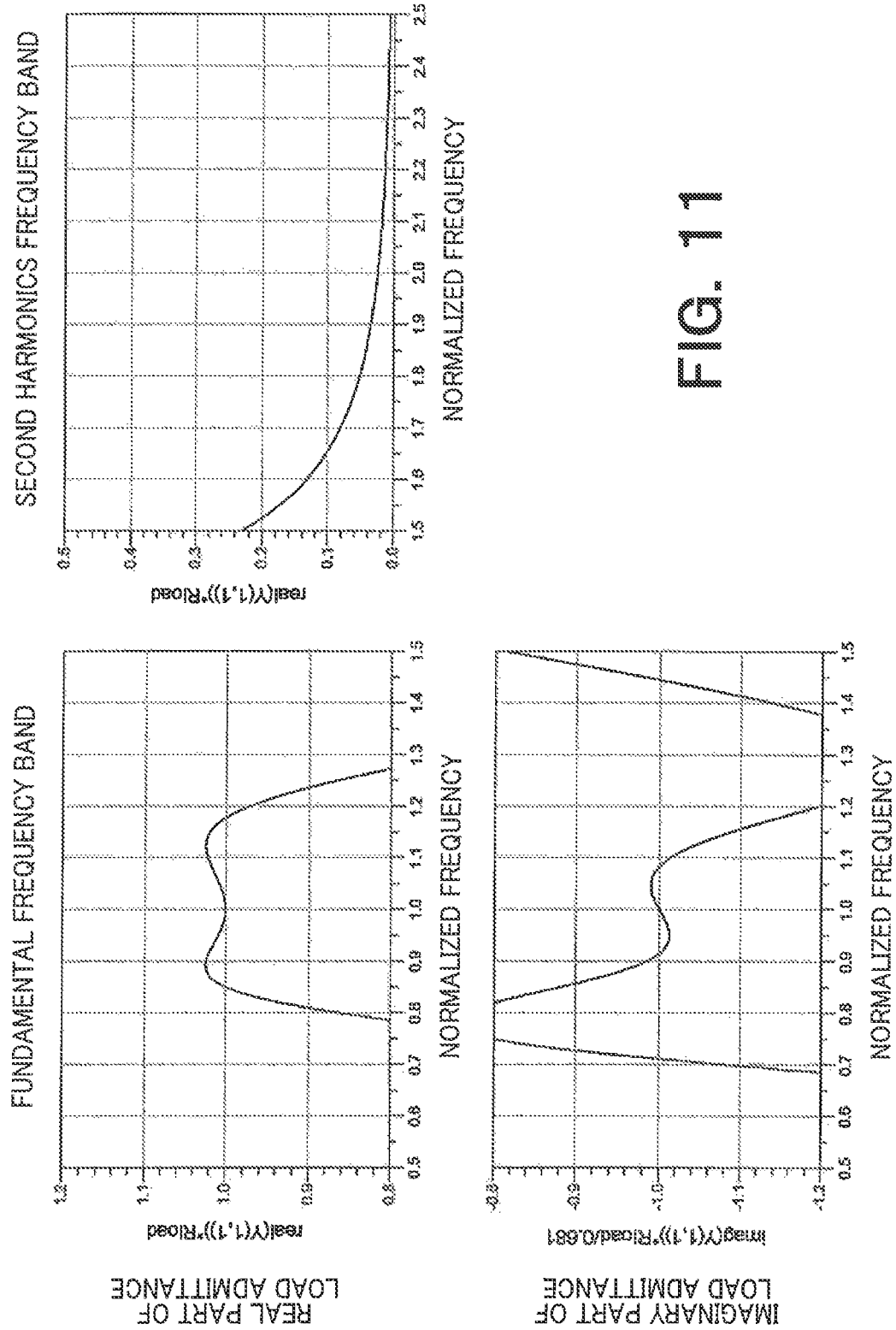
FIG. 11 is a diagram showing another example of the frequency characteristics of the amplifier according to the embodiment of the present invention.

FIG. 11 shows frequency characteristics in the case in which element values different from the element values in the case of FIG. 10 are selected. Compared with FIG. 10, although fluctuation widths of the real part and the imaginary part of the load admittance are large in the fundamental frequency band, a value of the real part of the load admittance is small in the second harmonics frequency band. That is, reflectivity of harmonics higher than the reflectivity in FIG. 10 can be obtained.

Figure 12:
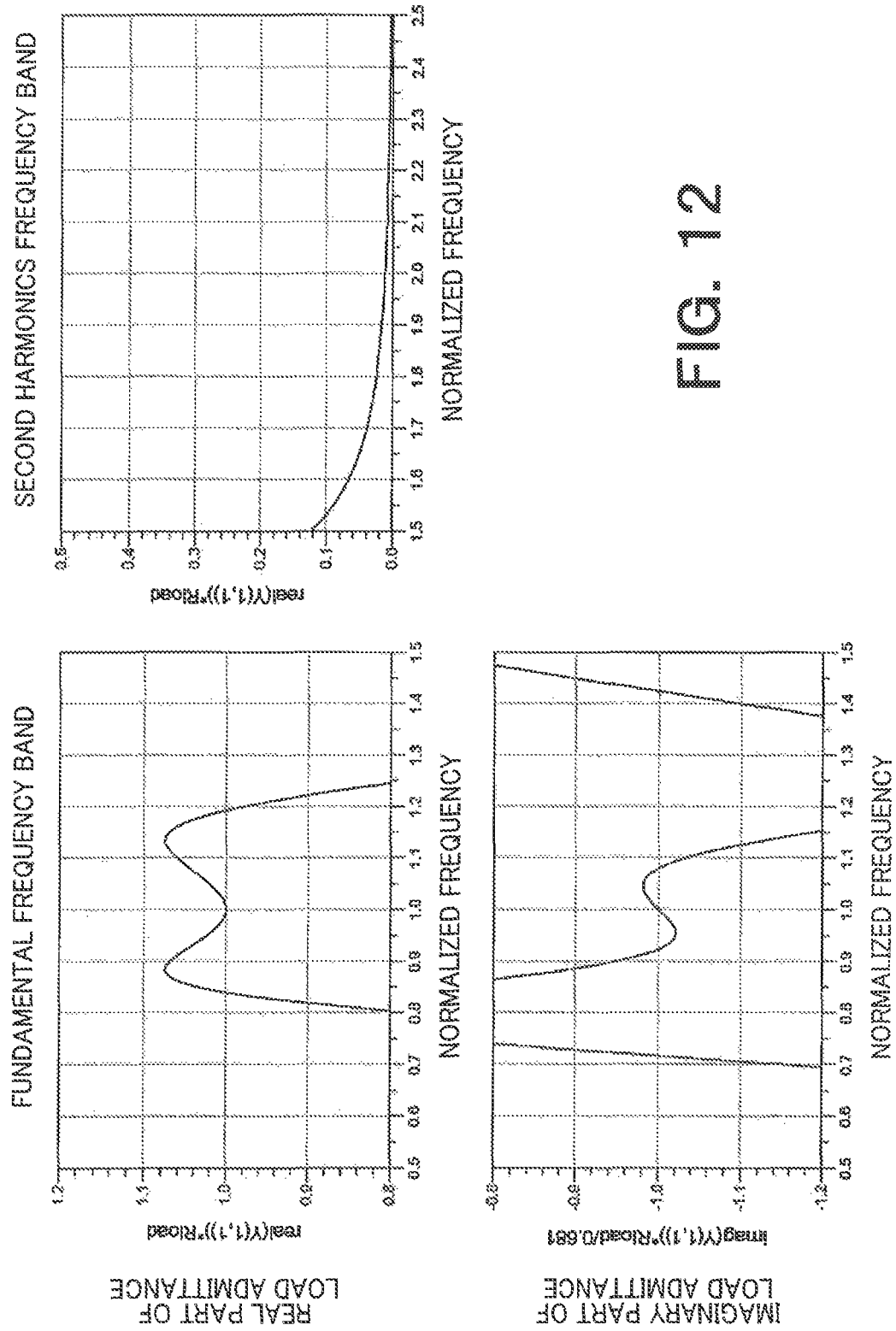
FIG. 12 is a diagram showing still another example of the frequency characteristics of the amplifier according to the embodiment of the present invention.

FIG. 12 shows frequency characteristics in the case in which element values different from the element values in the case of FIGS. 10 and 11 are selected. Compared with FIG. 11, although fluctuation widths of the real part and the imaginary part of the load admittance are large in the fundamental frequency band, a value of the real part of the load admittance is smaller in the second harmonics frequency band than the value in the case of FIG. 11. Consequently, more satisfactory reflectivity than the reflectivity in FIG. 11 can be obtained concerning harmonics.

The circuit element in the amplifier mentioned above can be divided (replaced with a plurality of elements) according to necessity. For example, the capacitor C0 can be divided into two, that is, a capacitor C0-1 and a capacitor C0-2 connected in series or parallel can be used instead of the capacitor C0. Consequently, it is possible to symmetrically form a circuit layout.

A contrivance is also possible to configure the transistor 103 by multiple combination (connection of a plurality of transistor elements) and dispose capacitors near the transistor elements. In this case, the connection circuit A may include a combined pattern of the transistor elements.

The connection circuit B can also be divided into a plurality of connection circuit portions B', B", B"', . . . . In this case, it is also possible to feed electric power from a plurality of places of the divided plurality of connection circuit portions B', B", B"', . . . . Places from which electric power is not fed may be present among the connection circuit portions.

It is also possible to connect a plurality of circuits or a part of the circuits from the transistor 103 to the load circuit 105 in parallel.

It is also possible to divide the transistor 103 into a plurality of transistors and connect a plurality of the amplifiers in parallel. For example, when two elements (transistors, etc.) are incorporated in one package, it is also possible to combine outputs of the elements in the connection circuit A and the outputs in one output circuit and one bias circuit 102. However, according to necessity, it is also possible to apply independent circuits to two outputs and combine electric power in the load circuit 105.

It is possible to reduce equivalent series resistance or equivalent series inductance and reduce the influence of component tolerance through division of components. It is possible to obtain an effect that, for example, convenience of adjustment is improved.

The circuit element in the amplifier can be realized by a lumped element circuit or a distributed element circuit or a combination of the lumped element circuit and the distributed element circuit.

For example, it is well known that the distributed element circuit can be alternately replaced with the lumped element circuit using an F matrix. For example, a transmission line having any characteristic impedance and electric length can be replaced with a $\pi$ low-pass filter, a $\pi$ high-pass filter, a T low-pass filter, and a T high-pass filter realized by a lumped element. Similarly, it is a well-known technique to make it possible to reduce the transmission line having any characteristic impedance and electric length by adding capacitances on an Input side and an output side.

It is also well known that an inductor and a capacitor are replaced with a transmission line. The Inductor and the capacitor can be replaced with a stub opened at a distal end, a stub short-circuited at a distal end, and a transmission line having any characteristic impedance.

Alternatively, it is also possible to replace an impedance conversion portion in the circuit of this application with a transformer. It is well known that the transformer can be realized by a lumped element or a distributed element.

The circuit element in the amplifier can be realized by a lumped element circuit or a distributed element circuit or a combination of the lumped element circuit and the distributed element circuit.

Output power of the amplifier can be combined by a general method. For example, 180° phase difference combination, 90° phase difference combination, and in-phase combination can be performed using a balun, a hybrid, a combiner, or the like. Phase differences are not limited to the phase differences described above. A power ratio of combination does not need to be 1:1 if the power ratio is appropriately designed.

Since efficiency of the amplifier at saturated power is high, the amplifier is applicable to a Doherty amplifier, an Outphasing amplifier including a Chreix combiner or the like, a LINC (Linear Amplification with Nonlinear Components) amplifier, an EER (Envelope Elimination and Restoration) amplifier, envelope tracking, an RF (Radio Frequency) pulse modulation amplifier, and the like.

Since the amplifier has a wideband characteristic, the amplifier is suitable for a combination with an amplification technique in which a band of an Input signal is widened by signal processing such as the Outphasing amplifier and the EER amplifier.

A part or the entire circuit element (matching element) in the amplifier can be replaced with a variable element. The amplifier has a wide band. However, it is possible to further widen the band and improve the performance of the amplifier by using the variable element.

The amplifier can also be combined with gate modulation (base modulation) or drain modulation (collector modulation). In particular, linear power control is possible in the drain modulation. The amplifier is suitable for amplification of an amplitude modulated signal.

In the amplifier, an AM-AM characteristic (a relation between input amplitude and output amplitude) or an AM-PM characteristic (a relation between input amplitude and an output phase) can be practically regarded as time-invariant like a general amplifier. Therefore, linearity can be improved by combining the amplifier with distortion compensation such as pre-distortion, feed-forward, or feedback. However, when the amplifier is combined with a technique for temporally controlling an operation condition such as drain modulation or load modulation, means capable of suppressing a memory effect should be selected.

It is obvious that an Inverse circuit in a complementary relation is present in the circuits of the amplifier in the first embodiment. In the amplifier, it is possible to realize an operation in which a relation between an electric current and a voltage is interchanged according to necessity like an inverse class-D as opposed to the class-D, an Inverse class-E as opposed to the class-E, an inverse class-F as opposed to the class-F.

As a form different from the above, a circuit topology of the amplifier in the first embodiment can be changed according to necessity by a method such as Norton conversion or n-T conversion. A converted circuit can obtain effects equivalent to the effects in the first embodiment. Examples of the converted circuit are explained as second to fourth embodiments.

Figure 4:
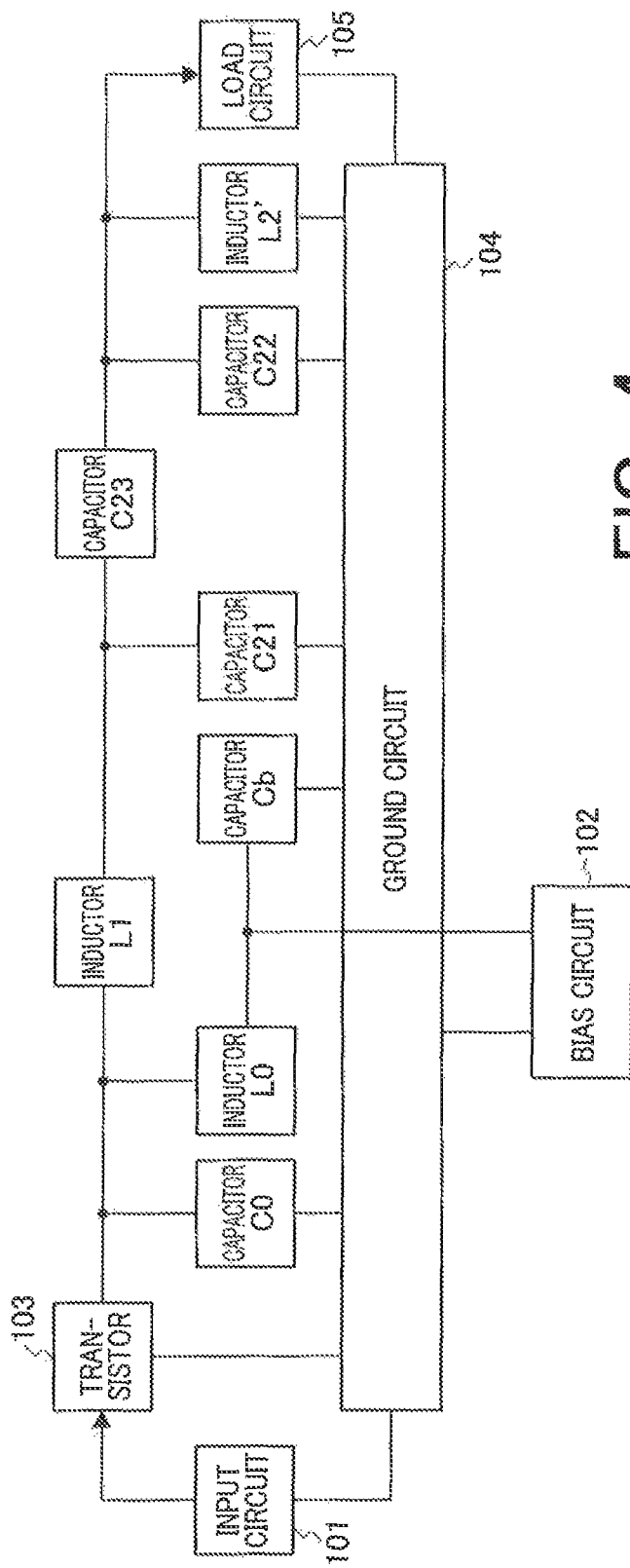
FIG. 4 is a circuit block diagram of an amplifier according to a second embodiment.

FIG. 4 shows an amplifier according to the second embodiment. The T structure of the capacitors C11, C12, and C13 shown in FIG. 1 is replaced with a n structure by capacitors C21, C22, and C23. The capacitor C23 is connected between the inductor L1 and the load circuit 105. The capacitor C21 is connected between a terminal on the inductor L1 side of the capacitor C23 and the ground circuit 104. The capacitor C22 is connected between the capacitor C23 and the ground circuit 104.

Figure 5:
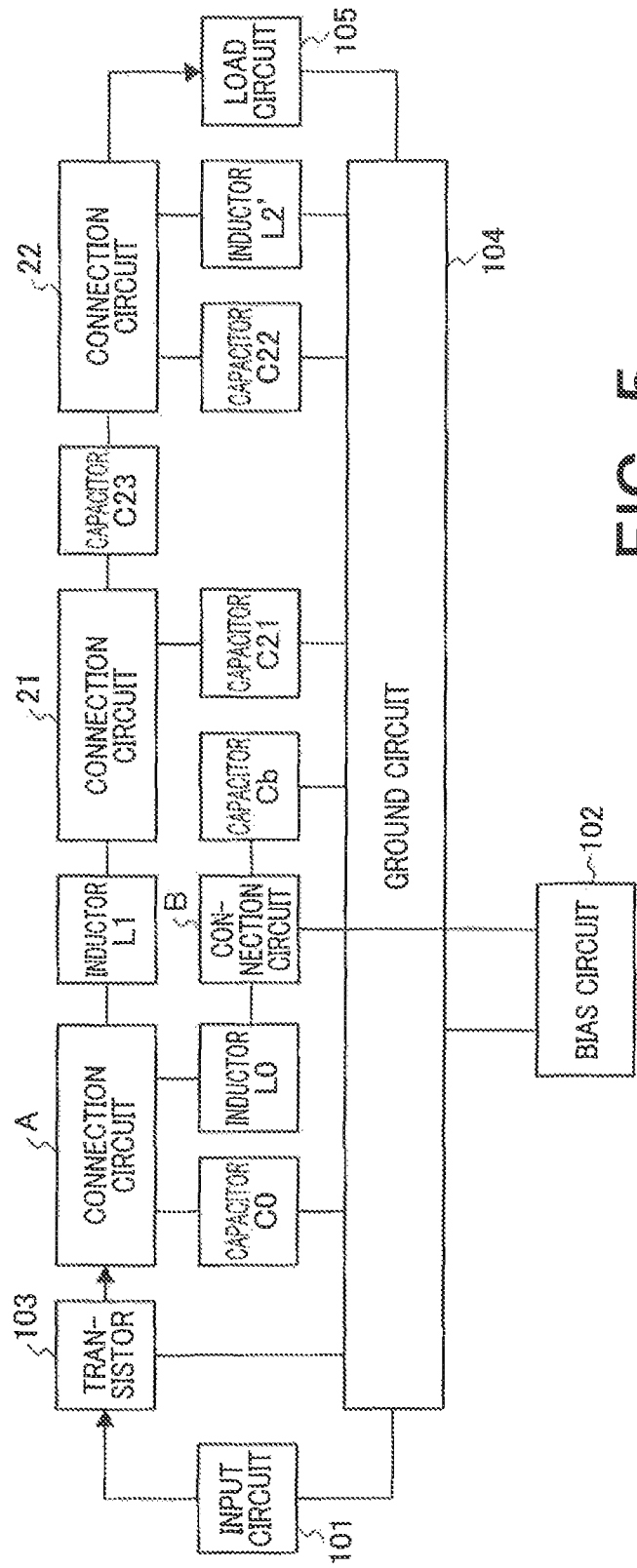
FIG. 5 is a diagram which uses connection circuits for connecting each element in the amplifier shown in FIG. 4.

In a circuit shown in FIG. 4, connection circuits for connecting a plurality of elements may be disposed. A circuit configuration example in this case is shown in FIG. 5. The connection circuit A, the connection circuit B, and the connection circuits 21 and 22 are added. The connection circuit A and the connection circuit B are the same as the connection circuit A and the connection circuit B shown in FIG. 3. The connection circuit 21 includes a plurality of terminals connected to the inductor L1, the capacitor C21, and the capacitor C23. The connection circuit 21 electrically connects the elements via the terminals. The connection circuit 22 includes a plurality of terminals connected to the capacitor C23, the capacitor C22, the inductor L2', and the load circuit 105. The connection circuit 22 electrically connects the elements via the terminals.

Figure 6:
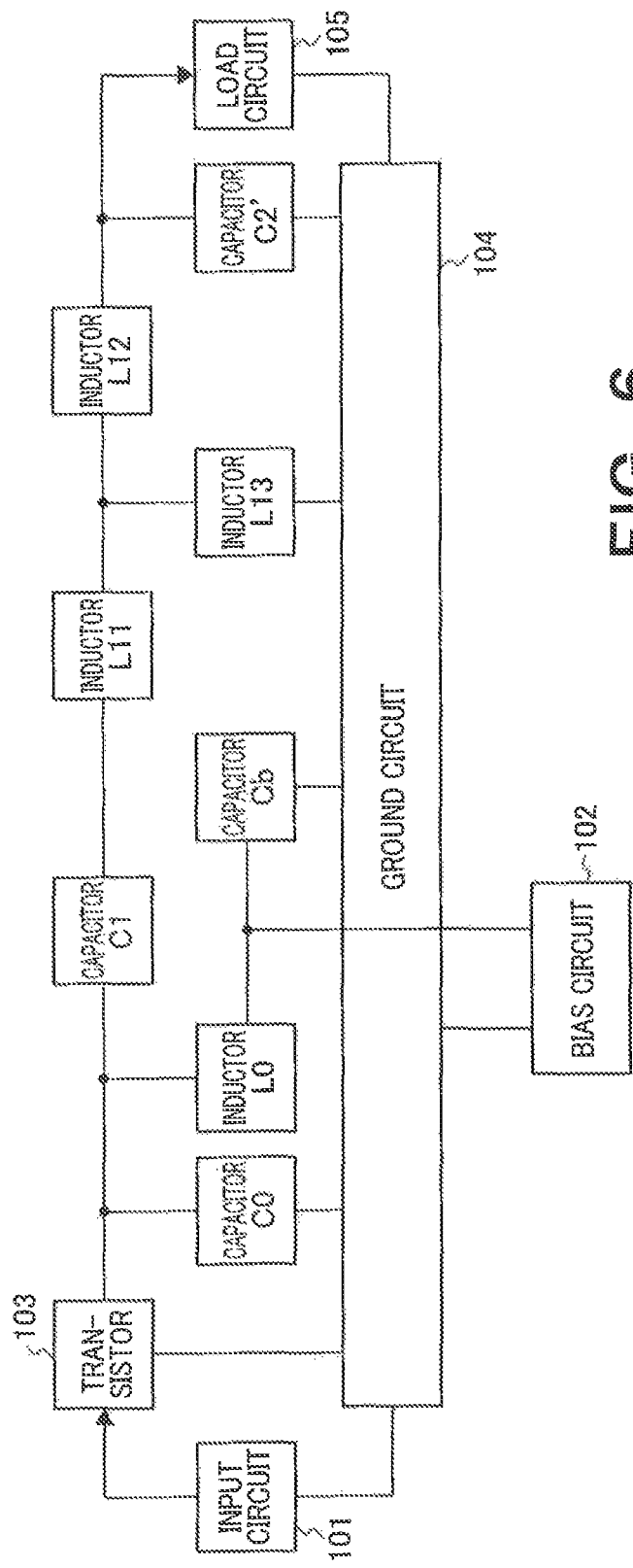
FIG. 6 is a circuit block diagram of an amplifier according to a third embodiment.

FIG. 6 shows an amplifier according to the third embodiment. The T structure of the capacitors C11, C12, and C13 shown in FIG. 1 is replaced with a T structure by inductors L11, L12, and L13 and the inductor L1 and the inductor L2' shown in FIG. 1 are respectively replaced with a capacitor C1 and a capacitor C2'. The connection order of the capacitor C1 and the inductor L11 may be reversed.

Figure 7:
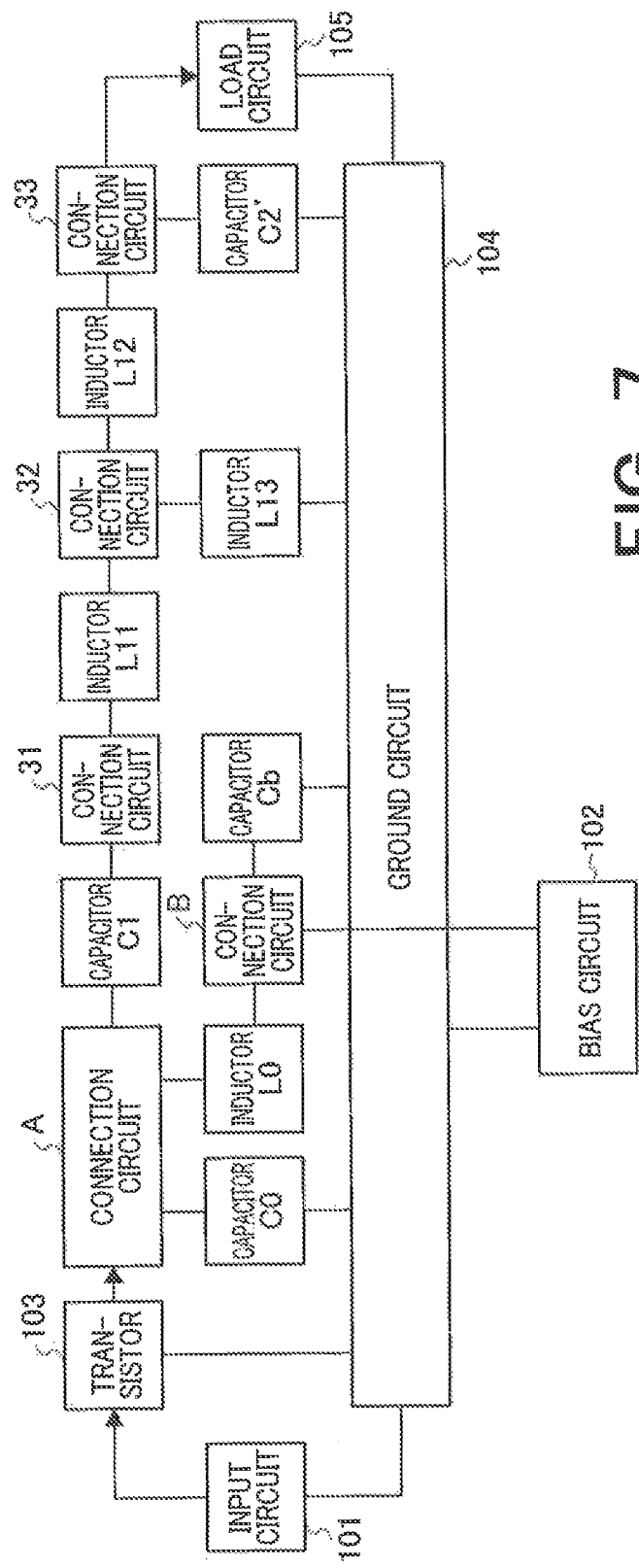
FIG. 7 is a diagram which uses connection circuits for connecting each element in the amplifier shown in FIG. 6.

In a circuit shown in FIG. 6, connection circuits for connecting a plurality of elements may be disposed. A circuit configuration example in this case is shown in FIG. 7. The connection circuit A, the connection circuit B, and connection circuits 31, 32, and 33 are added. The connection circuit B is the same as the connection circuit B shown in FIG. 3. The connection circuit A includes a plurality of terminals connected to the transistor 103, the capacitor C0, the inductor L0, and the capacitor C1. The connection circuit A electrically connects the elements via the terminals. The connection circuit 31 includes a plurality of terminals connected to the capacitor C1 and the inductor L11. The connection circuit 31 electrically connects the elements via the terminals. The connection circuit 32 includes a plurality of terminals connected to the inductor L11, the inductor L13, and the inductor L12. The connection circuit 32 electrically connects the elements via the terminals. The connection circuit 33 includes a plurality of terminals connected to the Inductor L12, the capacitor C2', and the load circuit 105. The connection circuit 33 electrically connects the elements via the terminals.

Figure 8:
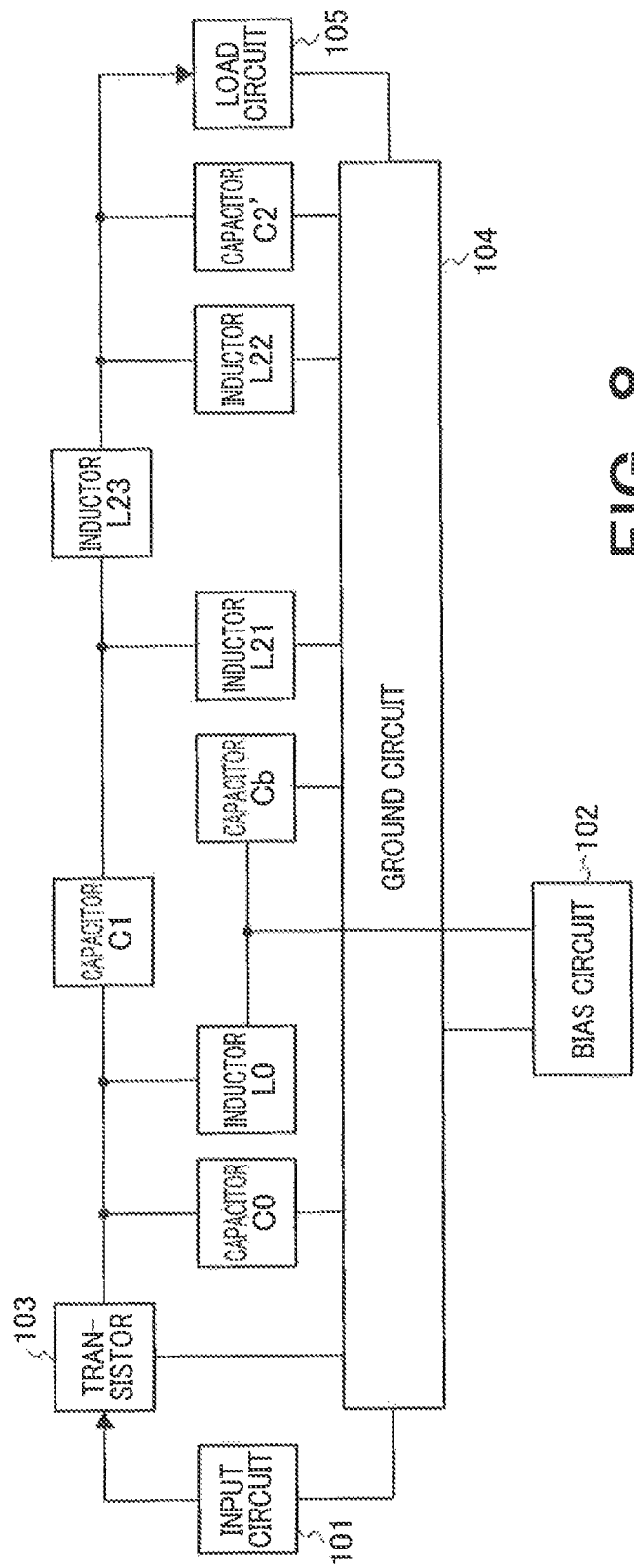
FIG. 8 is a circuit block diagram of an amplifier according to a fourth embodiment.

FIG. 8 shows an amplifier according to the fourth embodiment. The T structure by the Inductors L11, L12, and L13 in FIG. 6 is replaced with a π structure by inductors L21, L22, and L23.

Figure 9:
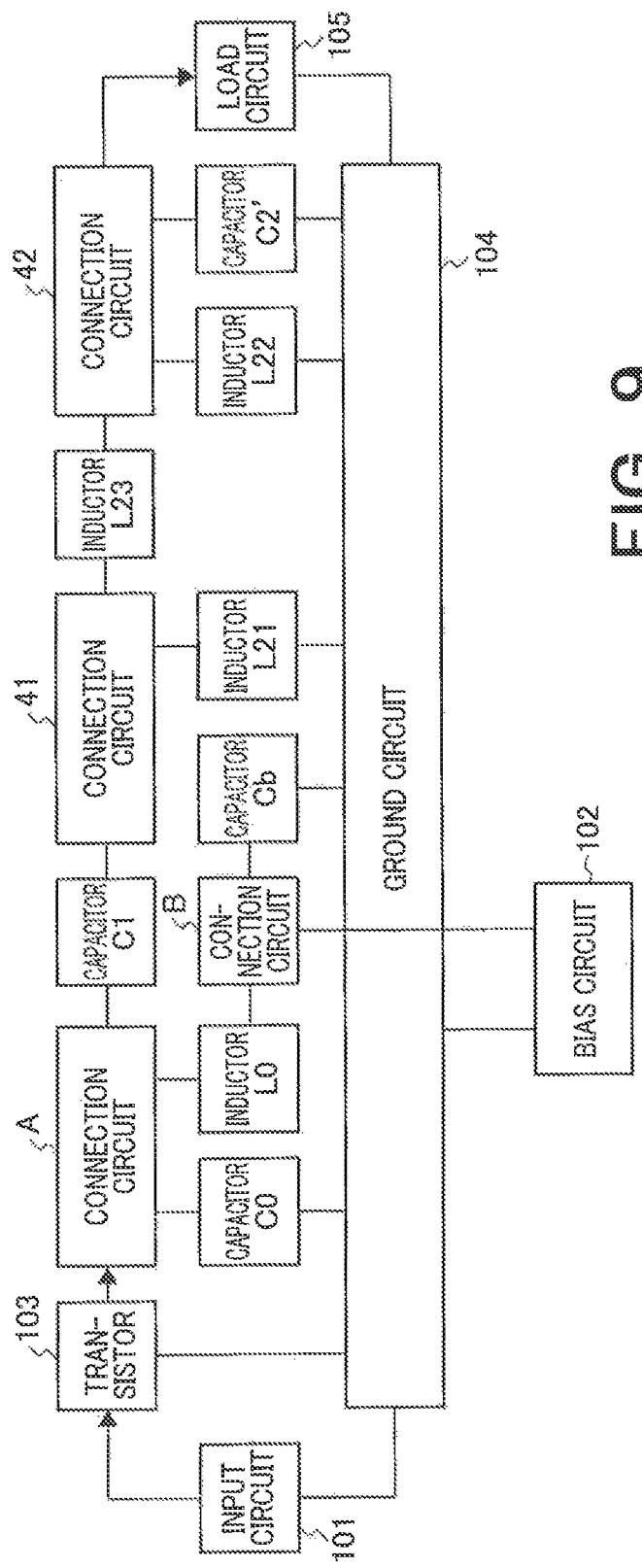
FIG. 9 is a diagram which uses connection circuits for connecting each element in the amplifier shown in FIG. 8.

In a circuit shown in FIG. 8, connection circuits for connecting a plurality of elements may be disposed. A circuit configuration example in this case is shown in FIG. 9. The connection circuit A, the connection circuit B, and connection circuits 41 and 42 are added. The connection circuit A and the connection circuit B are the same as the connection circuit A and the connection circuit B shown in FIG. 7. The connection circuit 41 includes a plurality of terminals connected to the capacitor C1, the Inductor L21, and the Inductor L23. The connection circuit 41 electrically connects the elements via the terminals. The connection circuit 42 includes a plurality of terminals connected to the Inductor L23, the inductor L22, the capacitor C2', and the load circuit 105. The connection circuit 42 electrically connects the elements via the terminals.

Element values for obtaining above-mentioned characteristics shown in FIGS. 10 to 12 are briefly explained. In the amplifier shown in FIG. 13 of the related technique, the inductance and the capacitance of the resonant circuit 910 are respectively represented as inductance Le and capacitance Ce. A resonant frequency of the resonant circuit 901 is represented as Fe and an angular frequency of the resonant circuit 901 is represented as we. Similarly, the inductance and the capacitance of the resonant circuit 911 are respectively represented as inductance Ls and capacitance Cs in a series resonant circuit. A resonant frequency of the resonant circuit 911 is represented as Fs, an angular frequency of the resonant circuit 911 is represented as ws, and a Q value of the resonant circuit 911 is represented as Qs. Similarly, the inductance and the capacitance of the resonant circuit 913 are respectively represented as inductance Lp and capacitance Cp in a parallel resonant circuit. A resonant frequency of the resonant circuit 913 is represented as Fp, an angular frequency of the resonant circuit 913 is represented as wp, and a Q value of the resonant circuit 913 is represented as Qp.

In this case, the capacitances of the capacitors C11, C12, and C13 shown in FIGS. 1 to 3 are set as follows. "*" is a multiplication operator, "/" is a division operator, "−" is a subtraction operator, and "+" is an addition operator.

$$C11=Ca=Cs*Cp/((1-n)*Cs+Cp)$$

$$C12=Cb=Cp/(n*n-n)$$

$$C13=Cc=Cp/n$$

Variables are defined as follows:

$$ws=2*\pi*Fs$$

$$wp=2*\pi*Fp$$

$$we=2*\pi*Fe$$

$$R\text{load}=10$$

$$R\text{term}=50$$

$$n=\text{sqrt}(R\text{term}/R\text{load})$$

$$Ls=1/(ws*ws*Cs)$$

$$Lp=1/(wp*wp*Cp)$$

$$Cs=1/(ws*R\text{load}*Qs)$$

$$Cp=Qp/(wp*R\text{load})$$

$$Le=0.732*R\text{load}/we$$

$$Ce=0.685/(w*R\text{load})$$

"sqrt" is a function for calculating a root of a given argument.

Rterm is a resistance component of the load circuit 105. In a high-frequency circuit, Rterm is usually 50 Ω.

"Rload" Is any class-E load impedance. More specifically, "Rload" Is load resistance of the load circuit 905 of the related technique shown in FIG. 13. For example, Rload is represented by the following equation:

$$R\text{load}=1.365*Vdd^2/P\text{out}$$

A coefficient 1.365 is an ideal value at the time when a duty ratio is 50%. The coefficient does not always have to be 1.365. In an actual circuit, the coefficient only has to be adjusted as appropriate taking into account a parasitic component. Vdd represents a power supply voltage and Pout represents output power.

Fs, Fp, and Fe are usually set to a design center frequency (Hz). However, if necessary, Fs, Fp, and Fe may be individually deviated from the design center frequency according to characteristics of the circuit.

Note that, ideally, Fe=Fs=Fp. However, in an actual circuit in which a parasitic component is present, Fs, Fp, and Fe are not limited to this. If Fe, Fs, and Fp are intentionally shifted, a preferred result is often obtained.

The characteristics shown in FIG. 10 are characteristics in the case of Qs=2 and Qp=1.0. The characteristics shown in FIG. 11 are characteristics in the case of Qs=2.2 and Qp=1.3. The characteristics shown in FIG. 12 are characteristics in the case of Qs=2.5 and Qp=1.7. The characteristics were obtained by a simulation. Qs and Qp are adjusted as appropriate in this way, capacitance of the capacitors C11, C12, and C13 are determined, and frequency characteristics of the amplifier are optimized. Note that, in the circuits shown in FIGS. 1 to 3, actually, the series resonator having the resonant frequency Qs and the parallel resonator having the resonant frequency Qp in the amplifier of the related technique are absent. However, as explained above, the circuits shown in FIGS. 1 to 3 can be represented using Qs and Qp.

The setting of the element values in the amplifiers (FIGS. 1 to 3) in the first embodiment is explained. However, in the amplifiers in the second to fourth embodiments, element values can be selected in the same manner.

Specifically, the capacitances of the capacitors C21, C22, and C23 in the second embodiment (FIGS. 4 and 5) can be represented as follows. Ca, Cc, and Cb are represented by the equations described above.

$$C21=ca*Cc/(Ca+Cb+Cc)$$

$$C22=Cb*Cc/(Ca+Cb+Cc)$$

$$C23=Ca*Cb/(Ca+Cb+Cc)$$

The inductances of the Inductors L11, L12, and L13 in the third embodiment (FIGS. 6 and 7) can be represented as follows:

$$L11=La=Ls+Lp*(1-n)$$

$$L12=Lb=(n*n-n)*Lp$$

$$L13=Lc=n*Lp$$

The inductances of the Inductors L21, L22, and L23 in the fourth embodiment (FIGS. 8 and 9) can be represented as follows:

$$L21=(La*Lb+Lb*Lc+Lc*La)/Lb$$

$$L22=(La*Lb+Lb*Lc+Lc*La)/La$$

$$L23=(La*Lb+Lb*Lc+Lc*La)/Lc$$

The numbers, constants, and sensitivities of the components used in the embodiments are different. An optimum embodiment can be selected according to a manufacturing method of the amplifier.

In the circuits in the first to fourth embodiments, an Inductor may be connected in parallel to the capacitor disposed in series to the load circuit 105 to add a harmonic trap by parallel resonance. For example, it is possible to connect an inductor in parallel to each of the capacitor C11 and the capacitor C12 in the first embodiment or in common to the capacitor C11 and the capacitor C12 and form a harmonic trap making use of parallel resonance. It is possible to connect an Inductor in parallel to the capacitor C23 in the second embodiment and form a harmonic trap making use of parallel resonance. It is possible to connect an inductor in parallel to the capacitor C1 in the third embodiment and form a harmonic trap making use of parallel resonance. It is possible to connect an inductor in parallel to the capacitor C1 in the fourth embodiment and form a harmonic trap making use of parallel resonance.

Similarly, in the circuits in the first to fourth embodiments, a capacitor may be connected in parallel to the inductor disposed in series to the load circuit 105 to add a harmonic trap by parallel resonance. For example, it is possible to connect a capacitor in parallel to the inductor L1 in the first embodiment and form a harmonic trap making use of parallel resonance. It is possible to connect a capacitor in parallel to the inductor L1 in the second embodiment and form a harmonic trap making use of parallel resonance. It is possible to connect a capacitor in parallel to each of the inductors L11 and L12 in the third embodiment or in common to the inductors L11 and L12 and form a harmonic trap making use of parallel resonance. It is possible to connect a capacitor in parallel to the inductor L23 in the fourth embodiment and form a harmonic trap making use of parallel resonance.

When the harmonic trap is formed as explained above, it is also possible to divide an original element to form a parallel resonator. For example, it is also possible to divide the inductor L1 in the first embodiment into a plurality of inductors L1a and L1b and add a capacitor in parallel to only a specific element, for example, the inductor L1a.

In an circuit in which the circuit topology in the first to fourth embodiments is converted as appropriate, it is also possible to connect an element (a capacitor or an inductor) in parallel to an element (an inductor or a capacitor) disposed in series to the load circuit 105 and add a harmonic trap by parallel resonance.

In the embodiments, mutual inductance is present among the plurality of inductors in the amplifier. That is, in the first embodiment (FIG. 1, etc.), the inductors L0, L1, and L2' have mutual inductance. Similarly, in the second embodiment (FIG. 4, etc.), the inductors L0, L1, and L2' have mutual inductance. Similarly, in the third embodiment (FIG. 6, etc.), the inductors L0, L11, L12, and L13 have mutual inductance. Similarly, in the fourth embodiment (FIG. 8, etc.), the inductors L0, L21, L22, and L23 have mutual inductance. Therefore, in disposition and design of the elements on the circuit or circuit adjustment, this point needs to be taken into account.

In the amplifiers according to the embodiments, in particular, in a saturated region, high power efficiency can be obtained compared with the existing technique. Therefore, the amplifier can be used in a high-frequency power supply that outputs a CW (Continuous Wave) in a radio frequency band and power-supply control circuits such as an RF power amplifier that amplifies a constant envelope phase modulation signal and a frequency modulation signal and a DC-DC converter. In particular, since performance is maintained in a wide frequency band, in the high-frequency power supply, it is possible to cope with, for example, fine adjustment of a frequency in power transmission, a change of a communication channel in the RF power amplifier, and a change of a switching frequency in the DC-DC converter.

The amplifiers according to the embodiments are not limited to specific uses and can be widely applied. For example, in communication and broadcast uses in which modulation signals having general amplitude modulation components are wide used such as a cellular phone terminal, a cellular phone base station, a cellular phone repeater, a wireless LAN access point, a wireless LAN station, a wireless access base station, a relay station, and a terminal such as WiMAX, a terrestrial digital broadcast transmitter, a terrestrial digital broadcast repeater, an AM broadcast transmitter, a fixed microwave communication apparatus, an STL/TTL apparatus, an FPU apparatus, a wireless apparatus for business use, a satellite communication apparatus such as VSAT, and road-to-vehicle and vehicle-to-vehicle communication such as ETC and DSRC, the amplifiers are used as an RF saturated amplifier in which power supply modulation by envelope tracking and EER and load modulation such as out fading/LINC/Doherty/Dynamic load line modulation are concurrently used.

The amplifiers according to the embodiments can be used in wireless apparatuses such as GSM, EDGE, DECT, and PHS adopting a modulation scheme with a relatively few amplitude modulation component even in a mobile communication and a wireless apparatus for power saving use.

The amplifiers according to the embodiments can be used in an FM transmitter, a PM transmitter, and a GMSK transmitter in which a constant envelope is used and transmitters for mobile communication, point-to-point communication, satellite communication, and the like in which a modulated wave of a PSK system is used.

The amplifiers according to the embodiments can be used in a radar, high-frequency heating, a high-frequency power supply, a power supply for plasma, radiolocation, a beacon, and the like in which saturated amplifiers are used.

The amplifiers according to the embodiments can be used in switching circuits such as a DC-DC converter. In particular, in the DC-DC converter, class-E amplification can be applied to both of a primary side and a secondary side. The DC-DC converter is also used in a wireless power transmission system and the like in which a primary side and a secondary side are separated and power transmission is performed by wireless.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions

The invention claimed is:

1. An amplifier comprising:
   a transistor;
   a ground circuit electrically connected to a ground terminal of the transistor;
   a first capacitor electrically connected between an output terminal of the transistor and the ground circuit;
   a first inductor electrically connected to the output terminal of the transistor;
   a second capacitor electrically connected between the first inductor and the ground circuit;
   a bias circuit connected between the first inductor and the ground circuit;

a first circuit electrically connected to the output terminal of the transistor, the first circuit including a second inductor and a third capacitor connected in series to the second inductor;

a fourth capacitor connected between the first circuit and a load circuit;

a fifth capacitor connected between an output terminal of the first circuit, which is a terminal on a load circuit side of the first circuit, and the ground circuit; and a third inductor connected between a terminal on a load circuit side of the fourth capacitor and the ground circuit.

2. The amplifier according to claim 1, wherein
the second inductor of the first circuit is electrically connected to the output terminal of the transistor, and
the third capacitor is connected between the second inductor and the fourth capacitor.

3. The amplifier according to claim 1, wherein
the third capacitor of the first circuit is electrically connected to the output terminal of the transistor, and
the second inductor is connected between the third capacitor and the fourth capacitor.

4. The amplifier according to claim 1, further comprising a first connection circuit, a second connection circuit, a third connection circuit, a fourth connection circuit, and a fifth connection circuit, wherein the first connection circuit connects the transistor, the first capacitor, the first inductor, and the first circuit to one another, the second connection circuit connects the first inductor, the second capacitor, and the bias circuit to one another, the third connection circuit connects the second inductor and the third capacitor in the first circuit to each other, the fourth connection circuit connects the first circuit, the fourth capacitor, and the fifth capacitor to one another, and the fifth connection circuit connects the fourth capacitor, the third inductor, and the load circuit to one another.

5. An amplifier comprising:
a transistor;
a ground circuit electrically connected to a ground terminal of the transistor;
a first capacitor electrically connected between an output terminal of the transistor and the ground circuit;
a first inductor electrically connected to the output terminal of the transistor;
a second capacitor electrically connected between the first inductor and the ground circuit;
a bias circuit connected between the first inductor and the ground circuit;
a second inductor electrically connected to the output terminal of the transistor;
a third capacitor connected between the second inductor and a load circuit;
a fourth capacitor connected between a terminal on a second inductor side of the third capacitor and the ground circuit;
a fifth capacitor connected between a terminal on a load circuit side of the third capacitor and the ground circuit; and
a third inductor connected between the terminal on a load circuit side of the third capacitor and the ground circuit.

6. The amplifier according to claim 5, further comprising a first connection circuit, a second connection circuit, a third connection circuit, and a fourth connection circuit, wherein the first connection circuit connects the transistor, the first capacitor, the first inductor, and the second inductor to one another, the second connection circuit connects the first inductor, the second capacitor, and the bias circuit to one another, the third connection circuit connects the second inductor, the third capacitor, and the fourth capacitor to one another, and the fourth connection circuit connects the third capacitor, the fifth capacitor, the third inductor, and the load circuit to one another.

7. An amplifier comprising:
a transistor;
a ground circuit electrically connected to a ground terminal of the transistor;
a first capacitor electrically connected between an output terminal of the transistor and the ground circuit;
a first inductor electrically connected to the output terminal of the transistor;
a second capacitor electrically connected between the first inductor and the ground circuit;
a bias circuit connected between the first inductor and the ground circuit;
a first circuit electrically connected to the output terminal of the transistor, the first circuit including a third capacitor and a second inductor connected in series to the third capacitor;
a third inductor connected between the first circuit and a load circuit;
a fourth inductor connected between a terminal on a first circuit side of the third inductor and the ground circuit; and
a fourth capacitor connected between a terminal on a load circuit side of the third inductor and the ground circuit.

8. The amplifier according to claim 7, wherein
the third capacitor of the first circuit is electrically connected to the output terminal of the transistor, and
the second inductor is connected between the third capacitor and the third inductor.

9. The amplifier according to claim 7, wherein
the second inductor of the first circuit is electrically connected to the output terminal of the transistor, and
the third capacitor is connected between the second inductor and the third inductor.

10. The amplifier according to claim 7, further comprising a first connection circuit, a second connection circuit, a third connection circuit, a fourth connection circuit, and a fifth connection circuit, wherein the first connection circuit connects the transistor, the first capacitor, the first inductor, and the first circuit to one another, the second connection circuit connects the first inductor, the second capacitor, and the bias circuit to one another, the third connection circuit connects the third capacitor and the second inductor in the first circuit to each other, the fourth connection circuit connects the first circuit, the third inductor, and the fourth inductor to one another, and the fifth connection circuit connects the third inductor, the fourth capacitor, and the load circuit to one another.

11. An amplifier comprising:
a transistor;
a ground circuit electrically connected to a ground terminal of the transistor;
a first capacitor electrically connected between an output terminal of the transistor and the ground circuit;

a first inductor electrically connected to the output terminal of the transistor;

a second capacitor electrically connected between the first inductor and the ground circuit;

a bias circuit connected between the first inductor and the ground circuit;

a third capacitor electrically connected to the output terminal of the transistor;

a second inductor connected between the third capacitor and a load circuit;

a third inductor connected between a terminal on a third capacitor side of the second inductor and the ground circuit;

a fourth inductor connected between a terminal on a load circuit side of the second inductor and the ground circuit; and a fourth capacitor connected between the terminal on a load circuit side of the second inductor and the ground circuit.

12. The amplifier according to claim 11, further comprising a first connection circuit, a second connection circuit, a third connection circuit, and a fourth connection circuit, wherein the first connection circuit connects the transistor, the first capacitor, the first inductor, and the third capacitor to one another, the second connection circuit connects the first inductor, the second capacitor, and the bias circuit to one another, the third connection circuit connects the third capacitor, the second inductor, and the third inductor to one another, and the fourth connection circuit connects the second inductor, the fourth inductor, the fourth capacitor, and the load circuit to one-another.

13. The amplifier according to claim 1, further comprising an input circuit configured to generate a signal to be amplified, wherein a control terminal of the transistor is electrically connected to the input circuit.

14. The amplifier according to claim 5, further comprising an input circuit configured to generate a signal to be amplified, wherein a control terminal of the transistor is electrically connected to the input circuit.

15. The amplifier according to claim 7, further comprising an Input circuit configured to generate a signal to be amplified, wherein a control terminal of the transistor is electrically connected to the input circuit.

16. The amplifier according to claim 11, further comprising an input circuit configured to generate a signal to be amplified, wherein a control terminal of the transistor is electrically connected to the input circuit.

* * * * *